(12) United States Patent
Kopf et al.

(10) Patent No.: US 6,567,276 B2
(45) Date of Patent: May 20, 2003

(54) ELECTROMAGNETIC INTERFERENCE SHIELD

(75) Inventors: Dale R Kopf, Middleton, ID (US); Jay D Reeves, Ste. Lucia Meridian, ID (US)

(73) Assignee: Hewlett-Packard Development Company L.P., Houston, TX (US)

( * ) Notice: Subject to any disclaimer, the term of this patent is extended or adjusted under 35 U.S.C. 154(b) by 0 days.

(21) Appl. No.: 09/839,853

(22) Filed: Apr. 20, 2001

(65) Prior Publication Data

US 2002/0154493 A1 Oct. 24, 2002

(51) Int. Cl.⁷ ................................................. H05K 9/00
(52) U.S. Cl. ....................... 361/818; 361/690; 361/800; 361/816; 174/35 R
(58) Field of Search ................................. 361/688, 690, 361/692, 816, 818, 800; 454/184; 174/35 R

(56) References Cited

U.S. PATENT DOCUMENTS

| 3,898,421 | A | * | 8/1975 | Suzumura ................. 200/241 |
| 4,127,758 | A | * | 11/1978 | Lowthorp .................. 200/5 A |
| 4,749,298 | A | * | 6/1988 | Bundt et al. ............. 165/134.1 |
| 5,530,202 | A | | 6/1996 | Dais et al. ................... 174/35 |
| 5,928,076 | A | * | 7/1999 | Clements et al. ......... 174/35 R |
| 6,063,152 | A | | 5/2000 | Teter ......................... 55/385.1 |
| 6,252,161 | B1 | * | 6/2001 | Hailey et al. ............. 174/35 R |
| 6,297,446 | B1 | * | 10/2001 | Cherniski et al. ...... 174/35 GC |

FOREIGN PATENT DOCUMENTS

| GB | 2209436 | 5/1989 |
| GB | 2275370 | 8/1994 |

* cited by examiner

Primary Examiner—Jayprakash N. Gandhi

(57) ABSTRACT

An EMI shield that utilzes perforated dimples or other features configured to reflect electromagnetic radiation while simultaneously permitting air flow through the shielding material.

5 Claims, 6 Drawing Sheets

ELECTROMAGNETIC INTERFERENCE SHIELD

FIELD OF THE INVENTION

The invention relates generally to electromagnetic interference (FMI) shielding in electronic systems.

BACKGROUND OF THE INVENTION

The operation of electronic circuitry used in many electronic devices is often accompanied by unwanted stray electromagnetic radiation. Stray electromagnetic radiation or "noise" can interfere with the performance of surrounding devices. Consequently, it is important to shield electronic devices to reduce electronic noise emanating from those devices.

Redundant arrays of inexpensive or independent storage devices (RAID) are being employed by the mass storage industry to provide variable capacity storage. RAID systems use interconnected disk drives to achieve the desired capacity of mass storage. With this approach, a disk drive of one capacity may be manufactured and packaged with the same or different capacity drives to provide the required storage capacity. RAID systems eliminate the need to manufacture disk drives individually designed to meet specific storage requirements. Each disk drive in a RAID system is usually housed in an individual module for handling and installation. The modules slide into and out of a larger enclosure that houses the array of disk drives and provides the sockets, plug-ins and other connections for the electrical interconnection of the drives. Controllers orchestrate the interconnection and control access to selected disk drives for data reading and writing operations.

Each module includes a plastic housing and, in most cases, some type of metal EMI shielding. Metal shielding is often constructed as metal plates, panels, partial enclosures and the like positioned within or about the housing. The metal attenuates stray electronic signals emanating from the module as well as stray signals coming from surrounding modules. The degree of attenuation increases with the amount, placement and composition of metal shielding. A closed metal box, for example, would provide excellent shielding. The housing, however, must also permit sufficient air flow to cool the device during operation. Hence, there must be adequate openings in the housing and the shielding to provide the necessary degree of cooling air flow.

SUMMARY OF THE INVENTION

The present invention is directed to an EMI shield that utilizes perforated dimples or other features configured to reflect electromagnetic radiation while simultaneously permitting air flow through the shielding material.

DETAILED DESCRIPTION OF THE INVENTION

Figure 1:
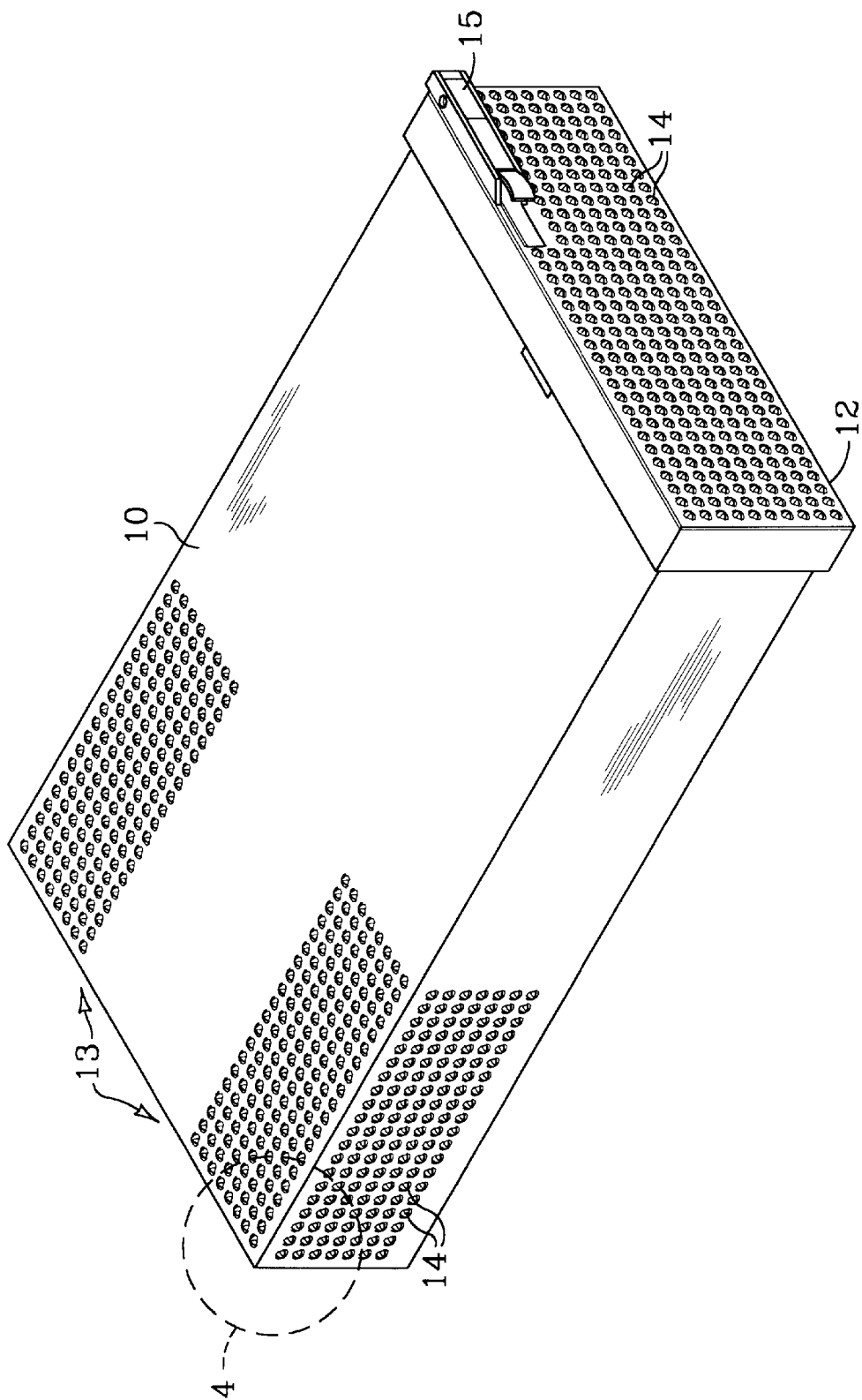
FIG. 1 is a perspective view of an enclosure for a disk drive or other electronic circuitry in which the front and rear portions of the enclosure are constructed as an EMI shield.

FIG. 1 illustrates an enclosure 10 for a disk drive, controller or other electronic circuitry in which the front panel 12 and rear portions 13 are constructed as an EMI shield through which cooling air can flow. A multiplicity of perforated dimples 14 are formed along front panel 12 and rear portions 13 of enclosure 10. Dimples 14 project out from enclosure 10. As described in more detail below, perforated dimples 14 permit cooling air flow while attenuating electromagnetic radiation or "noise" generated by the electronic circuitry inside enclosure 10. Some type of ejector latch 15 is typically used on front panel 12 to facilitate the installation and removal of enclosure 10 in a group housing unit such as the one described below for FIGS. 2 and 3.

Figure 2:
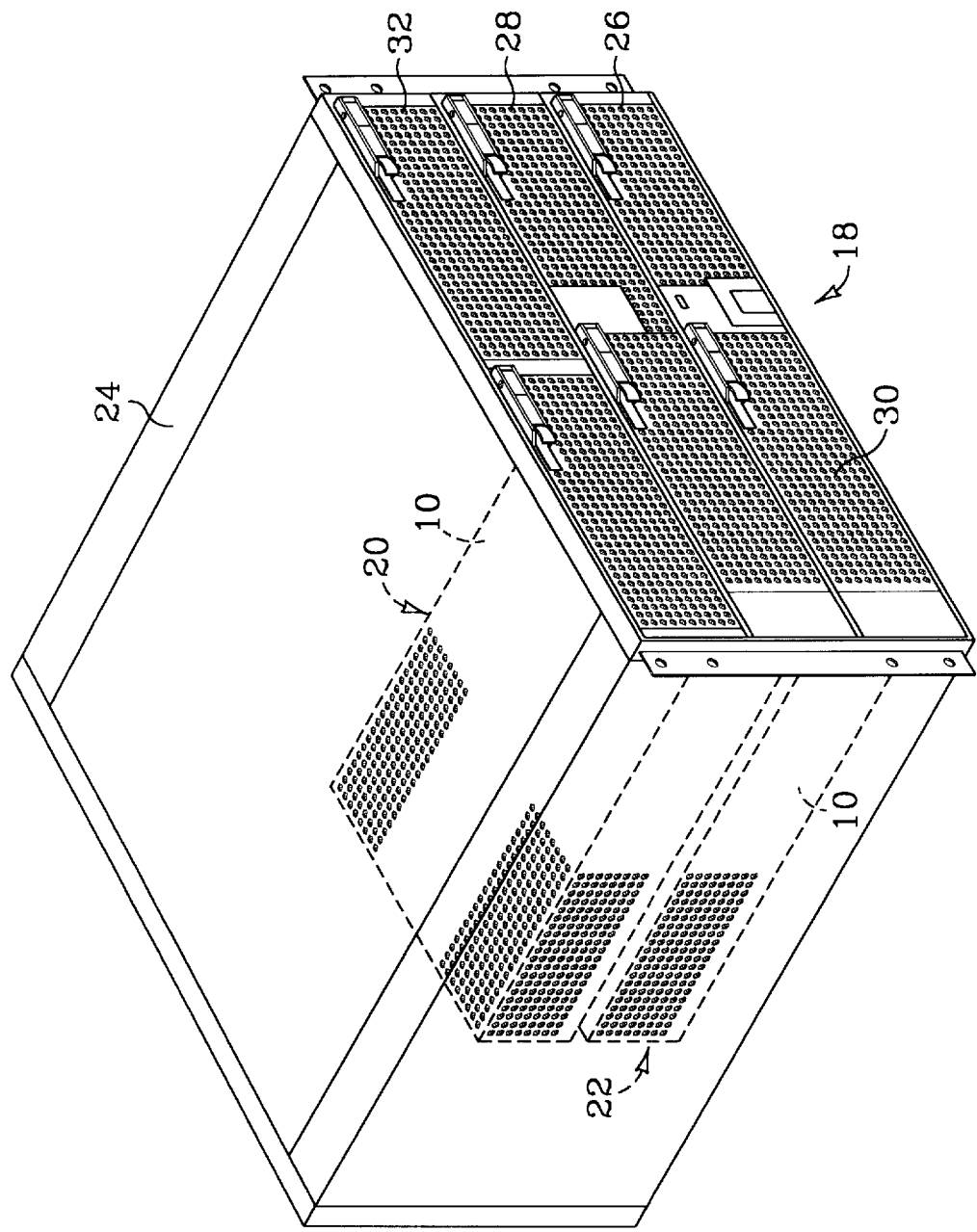
FIG. 2 is a perspective view of the front of a housing for a group of individual device modules, such as the disk drive modules used in RAID data storage systems. The electronic device in one or more of the modules may be housed in an enclosure like the one illustrated in FIG. 1.
Figure 3:
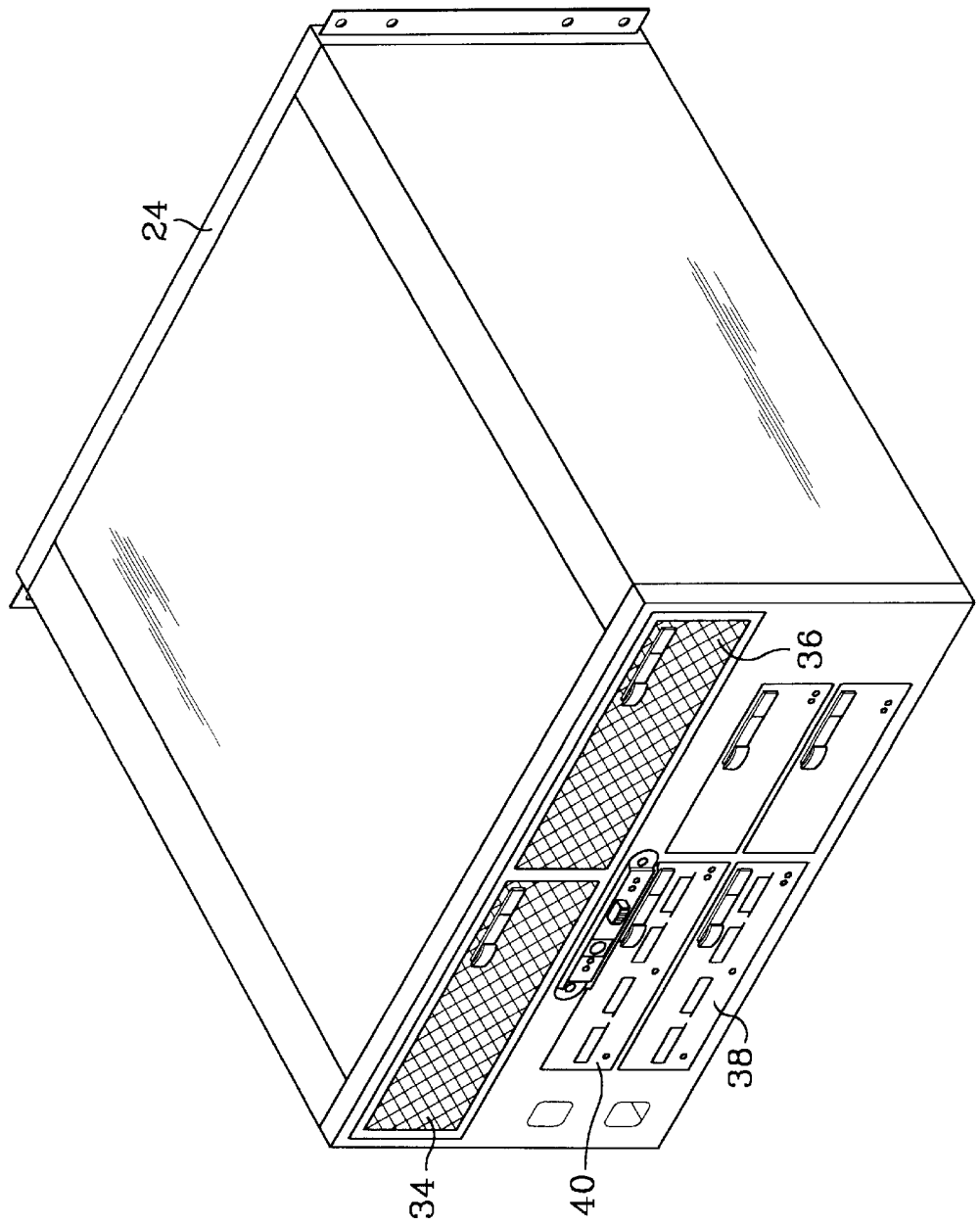
FIG. 3 is a perspective view of the rear of the housing of FIG. 2.

FIGS. 2 and 3 illustrate one example of a data storage system 18 with which the invention can be used. Referring to FIGS. 2 and 3, data storage system 18 includes a group of individual device modules 20 and 22, such as the disk drive modules used in a RAID data storage systems, housed in a housing 24. FIG. 2 shows the front of housing 24. FIG. 3 shows the rear of housing 24. The electronic device in each module 20 and 22 is housed in an enclosure like the one illustrated in FIG. 1. System 18 may also include, for example, power supplies 26 and 28, battery back-up units 30 and 32, cooling fan modules 34 and 36 and input/output modules 38 and 40. Power supplies 26 and 28 provide the necessary electrical power for system 18. Battery back-up units 30 and 32 provide an alternative power source in the event of a failure of one or more of the power supplies 26 and 28. Fan modules 34 and 36 circulate air through housing 24 to cool the components. The input/output modules 38 and 40 enable the system components to communicate with external devices. The front panels and other parts of the enclosures for power supplies 26 and 28 and battery back-ups 30 and 32 might also be constructed as EMI shields using the perforated dimples of the present invention.

Figure 4:
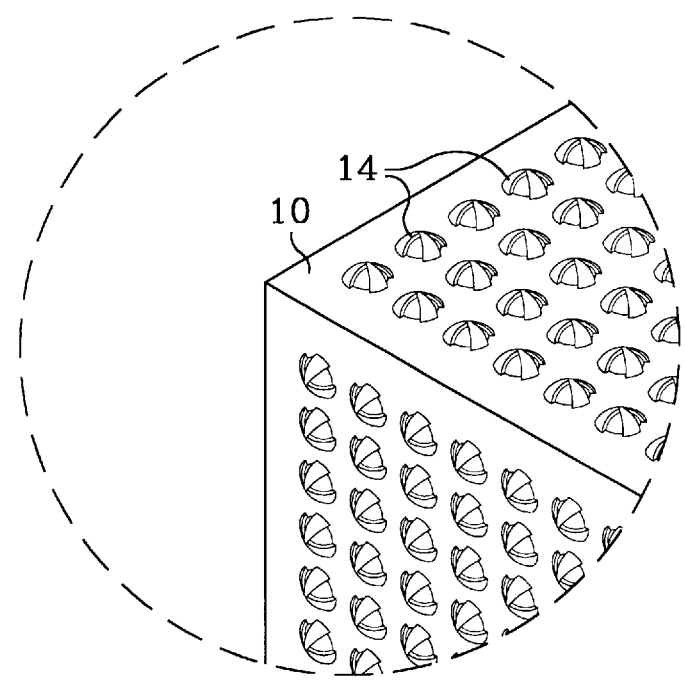
FIG. 4 is a close-up perspective view of the rear corner of the device module of FIG. 1 showing one embodiment of an EMI shield in which perforated parabolic dimples are used to attenuate electromagnetic radiation while allowing air flow through the shield.
Figure 5:
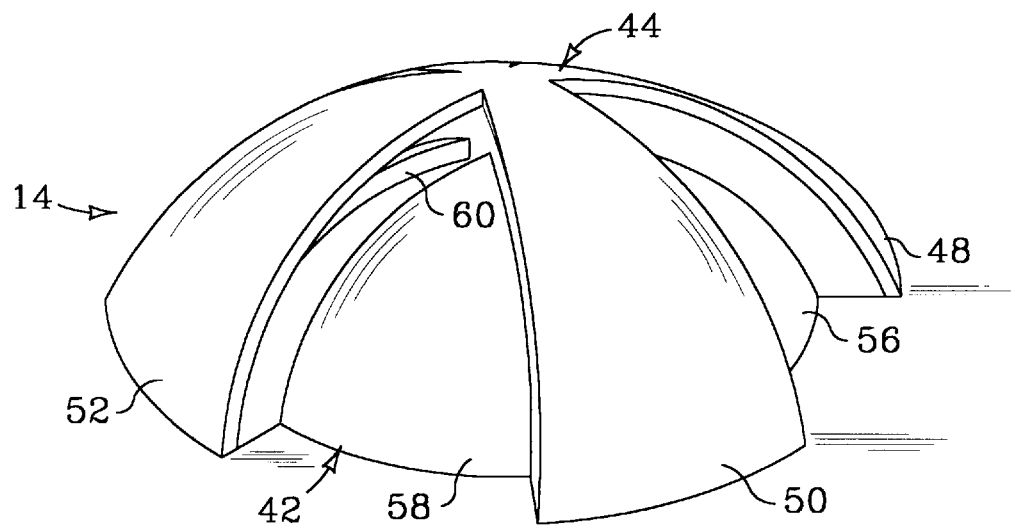
FIG. 5 is a detailed perspective view of one of the dimples of FIG. 4.
Figure 7:
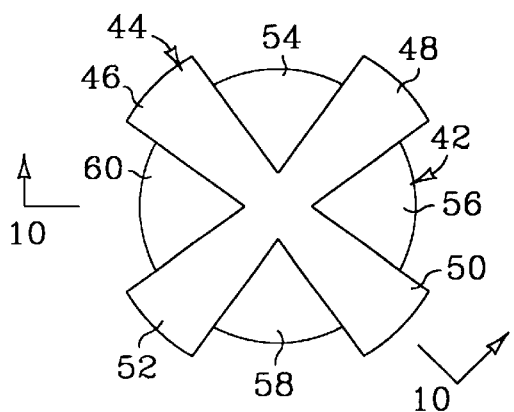
FIG. 7 is a plan view of the orientation of the dimple in FIG. 6 looking down on the dimple as indicated by the line 7–7 in FIG. 6.
Figure 8:
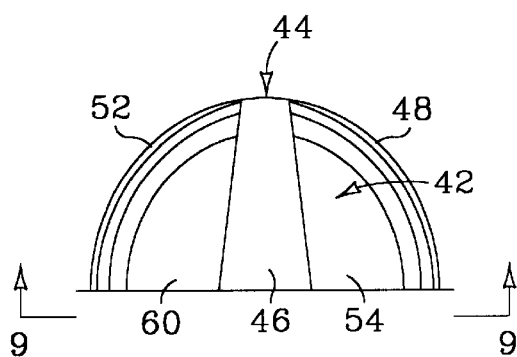
FIG. 8 is a side view of the dimple of FIG. 5 looking along one band of the outer dimple.
Figure 6:
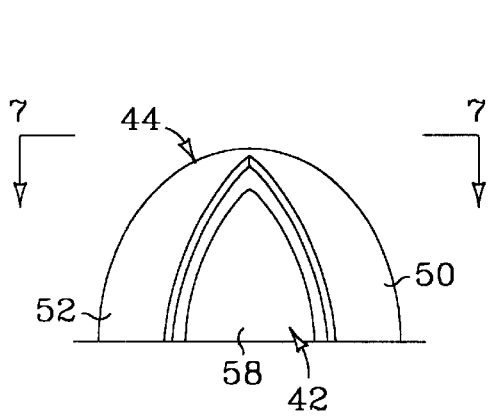
FIG. 6 is a side view of the dimple of FIG. 5 looking directly into the inner dimple between bands of the outer dimple.
Figure 9:
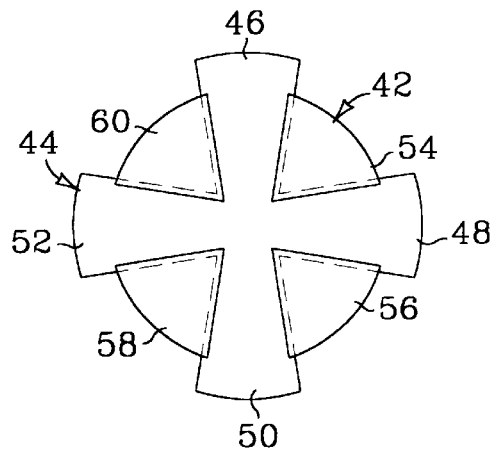
FIG. 9 is a plan view of the orientation of the dimple in FIG. 8 looking into the dimple as indicated by line 9–9 in FIG. 8 showing an alternative embodiment in which the bands overlap the underlying segments.
Figure 10:
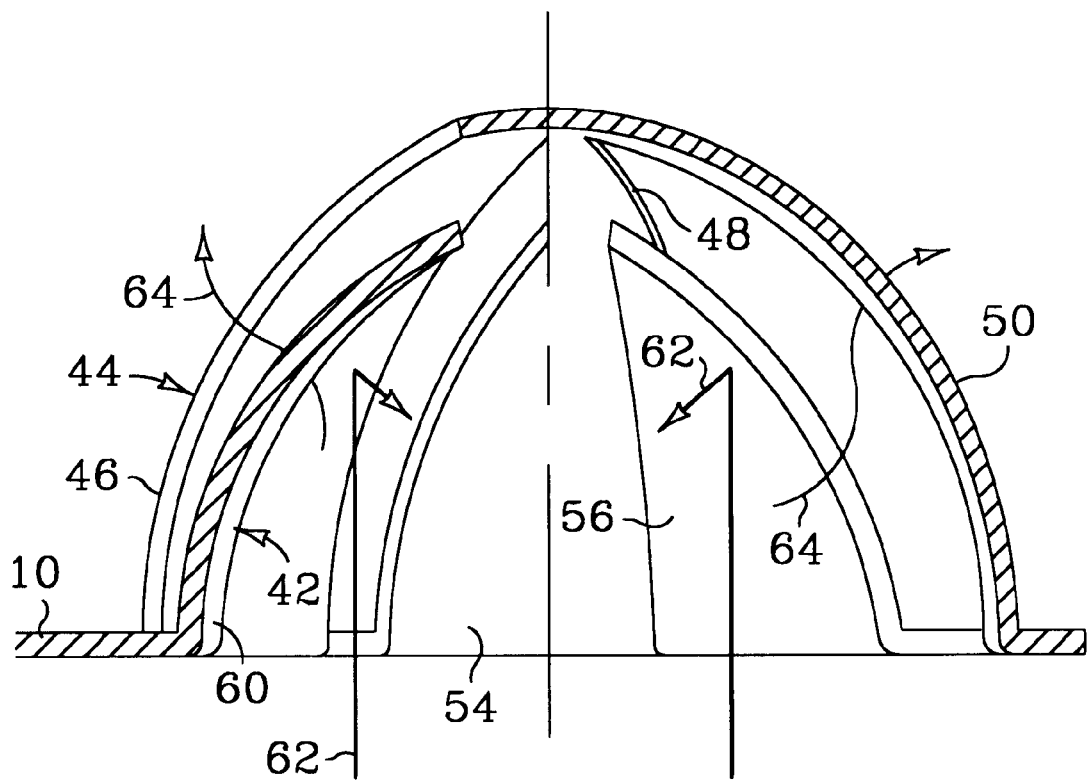
FIG. 10 is a section view taken along the line 10–10 in FIG. 7.

The details of one embodiment of dimples 14 will now be described with reference to FIGS. 4–10. FIG. 4 is a close-up perspective view of the rear corner of the device module enclosure 10 of FIG. 1. FIGS. 4–10 show one embodiment of an EMI shield in which perforated parabolic dimples 14 are used to attenuate electromagnetic radiation while allowing air flow through the shield. FIG. 5 is a detailed perspective view of one dimple 14. FIG. 6 is a side view of the dimple of FIG. 5 looking directly into the inner dimple between bands of the outer dimple. FIG. 7 is a plan view of the orientation of the dimple in FIG. 6 looking down on the dimple as indicated by the line 7—7 in FIG. 6. FIG. 8 is a side view of the dimple of FIG. 5 looking along one band of the outer dimple. FIG. 9 is a plan view of the orientation of the dimple in FIG. 8 looking into the dimple as indicated by line 9-9 in FIG. 8. FIG. 10 is a section view taken along the line 10—10 in FIG. 7.

Referring to FIGS. 4–10, each dimple 14 includes a segmented inner dimple 42 and a segmented outer dimple 44. In the embodiment shown in the figures, each segment or band 46, 48, 50 and 52 of outer dimple 44 is offset from segments 54, 56, 58 and 60 of inner dimple 42 such that the bands of outer dimple 44 cover the gaps between the segments of inner dimple 42. In the embodiment shown in FIG. 7, bands 46, 48, 50 and 52 are co-extensive with the gaps between segments 54, 56, 58 and 60. In the embodiment shown in FIG. 9, bands 46, 48, 50 and 52 overlap the underlying segments 54, 56, 58 and 60. Preferably, both inner dimple 42 and outer dimple 44 are parabolic. For parabolic dimples, the focal point of each dimple 42, 44 lies within enclosure 10 where the unwanted noise originates. In this way, noise is reflected off the parabolic dimples 42 and 44 back into enclosure 10, as indicated by arrows 62 in FIG. 10, while allowing air to pass through the dimples, as indicated by arrow 64 in FIG. 10.

"Dimple" characterizes the reflective feature as viewed from inside enclosure 10. These same features might also be characterized as "bumps" when viewed from the outside of enclosure 10. Hence, "dimple" is a relative term that refers generally to the desired reflective feature on enclosure 10 or, more generally, on any shielding material of interest.

Conventional EMI shielding relies on holes and/or waveguides in metal sheeting to permit air flow. The extent to which conventional EMI shielding attenuates stray electromagnetic radiation (i.e., "noise") depends on the cut-off frequency of the holes or waveguides and the number of holes or waveguides. The degree of electromagnetic attenuation of the dimpled structure of the present invention, by contrast, depends on the reflective properties of the electromagnetic radiation. If the electromagnetic radiation is below the cut-off frequency of a conventional waveguide, then the waveguide rapidly attenuates the signals. If, however, the electromagnetic radiation is above the cut-off frequency, then the signals pass readily through the waveguide. The dimpled structure of the present invention can be made to reflect part or all frequencies of electromagnetic radiation back into the enclosure, with the greatest reflective effect when the dimples are in the far-field for the frequency of interest. A dimple is in the far-field if the source of the electromagnetic radiation is at least $\lambda/2$ from the dimple where $\lambda$ is the wavelength. The wavelength of the radiation decreases as the frequency increases according to the relationship $\lambda=c/f$, where $\lambda$ is the wavelength, c is the speed of light and f is the frequency. For example, the far-field for electromagnetic radiation at a frequency of 5 GHz is about 9.5 mm and the far-field is closer than 9.5 mm for frequencies higher than 5 GHz. Hence, the dimpled construction of the present invention offers an effective alternative to conventional waveguides particularly for higher frequency radiation.

While it is expected that the parabolic dimples illustrated in FIGS. 4–10 will usually be formed in sheet metal using conventional stamping processes, they may be molded in conductive plastic sheets or plates or other fabrication materials and processes may be used. For sheet metal, a solid inner dimple is first pressed into the sheet and then the inner dimple and a bit of the surrounding sheet is lanced through and pressed out to form the cross shaped outer dimple 44 while leaving a segmented inner dimple 42. The size and shape of dimples 14 are dependent on the EMI shielding and air flow requirements for the particular device, module and system in which the dimples are used. For a typical disk drive or controller module in a RAID system in which higher frequency noise targeted for this new dimpled shielding, generally 1 Ghz and above, it is expected that inner dimple 42 and outer dimple 44 will be from a few millimeters deep to a few tens of millimeters deep.

The present invention has been shown and described with reference to the foregoing exemplary embodiment in which parabolic inner and outer dimples are used. Other embodiments are possible. For example, the EMI shielding may use only an outer dimple or only an inner dimple in cases where more air flow is necessary or desired and less noise attenuation may be tolerated. Although parabolic dimples are preferred for the reasons noted above, other shapes may be adequate in some applications. It should be understood, therefore, that the invention is to be construed broadly within the scope of the following claims.

What is claimed is:

1. An electromagnetic interference shield, comprising conductive material having a plurality of perforated parabolic dimples formed therein, each perforated dimple comprising an inner dimple characterized by parabolic segments separated by gaps and an outer dimple characterized by parabolic bands covering the gaps between the segments of the inner dimple.

2. An electromagnetic interference shield, comprising a conductive sheet and a plurality of perforated dimples in the sheet, each dimple comprising a segmented inner dimple and a banded outer dimple, the bands of the outer dimple at least partially covering gaps between segments of the inner dimple.

3. The shield of claim 2, wherein the segments of the inner dimple and the bands of the outer dimple are parabolic.

4. An electromagnetic interference shielded electronic module, comprising:

an electronic device capable of generating electromagnetic radiation; and a housing at least partially enclosing the electronic device, the housing having a plurality of walls at least one of which comprises a conductive material having a plurality of perforated dimples formed therein, each perforated dimple comprising an inner dimple characterized by parabolic segments separated by gaps and an outer dimple characterized by parabolic bands covering the gaps between the segments of the inner dimple.

5. An electromagnetic interference shielded electronic module, comprising:

an electronic device capable of generating electromagnetic radiation; and a housing at least partially enclosing the electronic device, the housing having a plurality of walls at least one of which comprises a conductive material having a plurality of perforated dimples formed therein, each dimple comprising a segmented inner dimple and a banded outer dimple, the bands of the outer dimple at least partially covering gaps between segments of the inner dimple.

* * * * *